United States Patent
Fowler

(10) Patent No.: US 6,339,363 B1
(45) Date of Patent: Jan. 15, 2002

(54) LOW FPN HIGH GAIN CAPACITIVE TRANSIMPEDANCE AMPLIFIER FOR USE WITH CAPACITIVE SENSORS

(75) Inventor: Boyd Fowler, Sunnyvale, CA (US)

(73) Assignee: Pixel Devices International, Sunnyvale, CA (US)

( * ) Notice: Subject to any disclaimer, the term of this patent is extended or adjusted under 35 U.S.C. 154(b) by 0 days.

(21) Appl. No.: 09/729,756

(22) Filed: Dec. 4, 2000

(51) Int. Cl.[7] ................................................ H03F 3/08
(52) U.S. Cl. ........................ 330/308; 330/9; 250/214 A; 327/337
(58) Field of Search ................................ 330/9, 51, 86, 330/110, 308; 250/214 A; 327/337, 344, 345, 554

(56) References Cited

U.S. PATENT DOCUMENTS

| | | | |
|---|---|---|---|
| 4,210,872 A | * | 7/1980 | Gregorian ........................ 330/9 |
| 4,393,351 A | * | 7/1983 | Gregorian et al. ........... 328/127 |
| 5,377,524 A | * | 1/1995 | Wise et al. .................... 73/4 R |
| 6,169,440 B1 | * | 1/2001 | Liu .............................. 327/337 |

* cited by examiner

Primary Examiner—Robert Pascal
Assistant Examiner—Henry Choe
(74) Attorney, Agent, or Firm—Calvin B. Ward

(57) ABSTRACT

An amplifier for measuring the charge stored on a source capacitor having a capacitance $C_{pd}$. The amplifier includes an opamp having a signal input, reference input and output; the first terminal of the source capacitor is connected to the signal input. The amplifier includes a reset switch for shorting the signal input and the output of the opamp, and a capacitive network. The capacitive network connects the signal input and the output of the opamp, and provides a capacitance of $C_T$ between the signal input and the output of the opamp wherein $C_T < C_{pd}$. The capacitive network is constructed from a plurality of component capacitors. Preferably each component capacitor has a capacitance greater than or equal to $C_{pd}$. In one embodiment of the invention, the capacitive network includes first, second, and third component capacitors, each capacitor having first and second terminals. The first terminal of the first capacitor is connected to the output of the opamp; the second terminal of the first capacitor, the first terminal of the second capacitor, and the first terminal of the third capacitor are connected together at a first common node, the second terminal of the third capacitor is connected to the signal input of the opamp, and the second terminal of the second capacitor is connected to the second terminal of the parasitic capacitor. The capacitive network also includes a first network switch for connecting the first common node to the output of the opamp.

4 Claims, 2 Drawing Sheets

LOW FPN HIGH GAIN CAPACITIVE TRANSIMPEDANCE AMPLIFIER FOR USE WITH CAPACITIVE SENSORS

FIELD OF THE INVENTION

The present invention relates to capacitive transimpedance amplifiers, and more particularly, to capacitive transimpedance amplifiers suited for reading capacitive sensors such as CMOS image sensors.

BACKGROUND OF THE INVENTION

The present invention can be more easily understood in the context of arrays of CMOS image sensors. However, it will be apparent to those skilled in the art from the following discussion that the present invention may be applied to other circuitry in which the charge on a capacitor or array of capacitors must be measured.

In principle, CMOS image sensors provide a number of advantages over CCD image sensors. The CMOS yields are significantly better than those of the CCD fabrication process. In addition, the minimum noise levels achievable with CMOS-based sensors are substantially lower than those that can be obtained with CCDs.

The uses for CMOS image sensing arrays have been limited, however, by so called "fixed pattern noise" (FPN). Each image sensor in a CMOS array typically includes an amplifier for converting the small amount of charge stored on the parasitic capacitance of the imaging element to a voltage or current. Consider an array of such imaging elements. To provide a high quality image, each element must have the same response characteristics. Consider an imaging array in which the amplifier generates a voltage that is linearly related to the amount of light that fell on the imaging element. Each imaging element can be characterized by an offset and gain. That is, the voltage, $V_i$, generated by the $i^{th}$ amplifier is related to the offset, $O_i$, for that element and the gain, $G_i$, by $$V_i = O_i + G_i I \qquad (1)$$

where I is the light incident on the $i^{th}$ element since the last time the imaging element was reset. To provide a high quality image all of the $O_i$ must be the same, i.e., $O_i=O$, and all of the gains, $G_i$ must be the same, i.e., $G_i=G$. The extent to which $O_i$ is different from O is referred to as the offset FPN of the array, and the extent to which $G_i$ is different from G is referred to as the gain FPN of the array. It should be noted that these noise values are constant for any given array. For any given pixel, $G_i-G$ does not change in time.

In addition to the offset and gain FPN, there is a third type of noise, referred to as the temporal noise, which reflects the variation of $V_i$ from measurement to measurement. This noise is related to the various shot, thermal, and 1/f noise sources in the image sensor.

As CMOS sensors are pushed to ever-lower light levels, the relative magnitude of the gain and offset FPN increases leading to degraded images. To provide the high gain levels needed at low light levels without introducing additional temporal noise, capacitive transimpedance amplifiers are used. The gain of such amplifiers depends on the ratio of the capacitance of the sensor to that of the capacitance of the feedback loop in the amplifier. Hence, to obtain high gain, the feedback capacitor must be much smaller than the sensor capacitor. The variations in these capacitors determines the gain FPN of the array. Hence, the dimensions of the capacitors must be held to very tight tolerances to prevent the introduction of gain FPN.

A capacitor is constructed by overlapping two metal electrodes that are separated by a dielectric layer. For any given fabrication process, there is a point at which the ability to control the degree of overlap and size of the electrodes becomes a problem. In general, one would like to have the capacitance of the photodiode be as small as possible so that the charge sensitivity will be as high as possible. Hence, the photodiode capacitance is set to be just big enough to assure that the capacitance does not vary substantially among the imaging elements. However, if this is the case, the feedback capacitor, which must have a small fraction of the capacitance of the photodiode, will be too small to be reliably constructed.

Broadly, it is the object of the present invention to provide an improved capacitive sensor.

It is a further object of the present invention to provide a capacitive sensor that has reduced gain FPN relative to prior art devices.

It is a still further object of the present invention to provide a capacitive sensor that has reduced temporal reset noise.

These and other objects of the present invention will become apparent to those skilled in the art from the following detailed description of the invention and the accompanying drawings.

SUMMARY OF THE INVENTION

The present invention is an amplifier for measuring the charge stored on a source capacitor having a capacitance $C_{pd}$. The amplifier includes an opamp having a signal input, reference input and output; the first terminal of the source capacitor is connected to the signal input. The amplifier includes a reset switch for shorting the signal input and the output of the opamp, and a capacitive network. The capacitive network connects the signal input and the output of the opamp, and provides a capacitance of $C_T$ between the signal input and the output of the opamp wherein $C_T<C_{pd}$. The capacitive network is constructed from a plurality of component capacitors. Preferably each component capacitor has a capacitance greater than or equal to $C_{pd}$. In one embodiment of the invention, the capacitive network includes first, second, and third component capacitors, each capacitor having first and second terminals. The first terminal of the first capacitor is connected to the output of the opamp; the second terminal of the first capacitor, the first terminal of the second capacitor, and the first terminal of the third capacitor are connected together at a first common node, the second terminal of the third capacitor is connected to the signal input of the opamp, and the second terminal of the second capacitor is connected to the second terminal of the parasitic capacitor. The capacitive network also includes a first network switch for connecting the first common node to the output of the opamp.

DETAILED DESCRIPTION OF THE INVENTION

Figure 1:
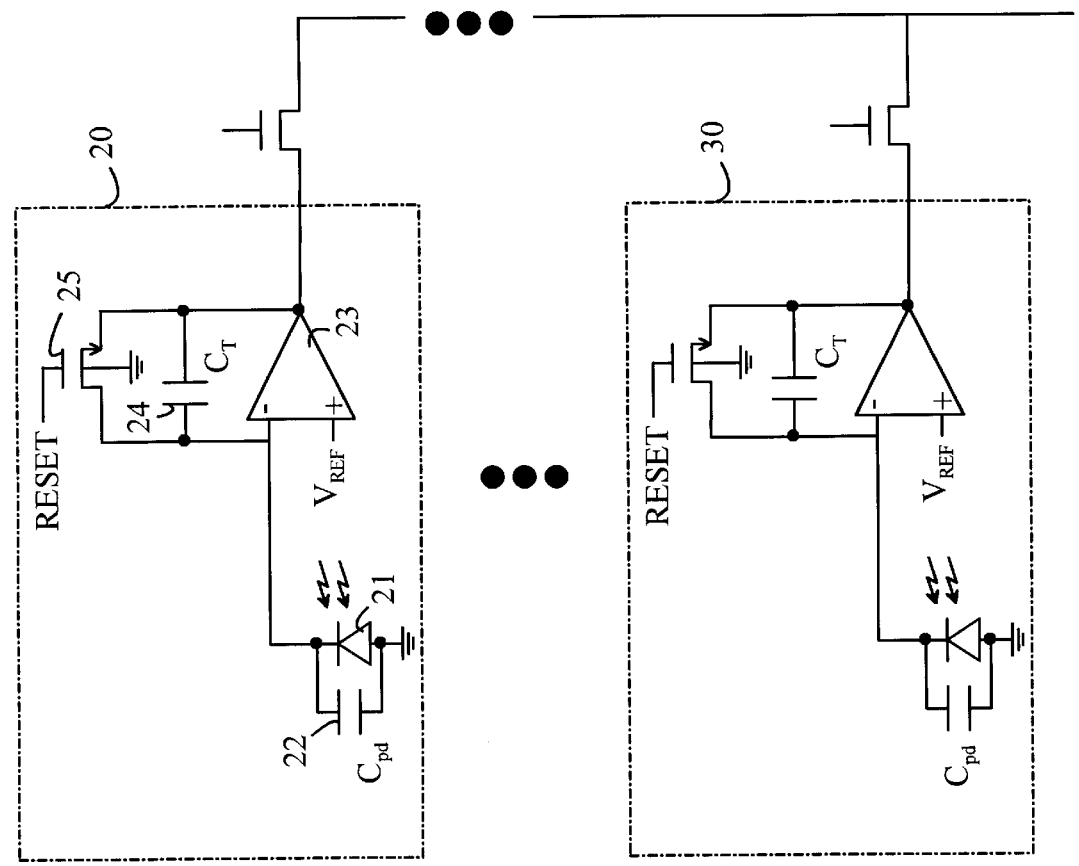
FIG. 1 is a schematic drawing of a portion of a prior art image sensor array 10 resenting one column of a two-dimensional array.

The manner in which the present invention obtains its advantages can be more easily understood with reference to FIG. 1 which is a schematic drawing of a portion of prior art image sensor array 10. The portion of the array shown in FIG. 1 represents one column of a two-dimensional array. Exemplary imaging elements are shown at 20 and 30. Each imaging element in the column includes a photodiode and a capacitive transimpedance amplifier. The photodiode for imaging element 20 is shown at 21. The photodiode has a parasitic capacitance shown at 22. The capacitance of this capacitor will be denoted by $C_{pd}$ in the following discussion. The transimpedance amplifiers are constructed from an opamp (operational amplifier) and a capacitive feedback loop. The opamp for imaging element 20 is shown at 23, and the feedback capacitor is shown at 24. The capacitance of the feedback capacitor will be denoted by $C_T$ in the following discussion. Each imaging element also has a reset switch for shorting the input and output of the opamp prior to accumulating charge. The reset switch is typically a transistor such as transistor 25.

The gain of the transimpedance amplifier is proportional to $C_{pd}/C_T$. Hence, to provide high gain, $C_{pd} \gg C_T$. In addition, to minimize gain FPN, $C_{pd}/C_T$ needs to be constant over the array. $C_{pd}$ is normally set to be as small as possible because $C_{pd}$ is proportional to pixel size and pixel size is proportional to sensor cost. Since $C_{pd} \gg C_T$ and $C_{pd}$ is typically very small, $C_T$ is too small to be reproducible over the array, and the resulting arrays have suffered from gain FPN.

Figure 2:
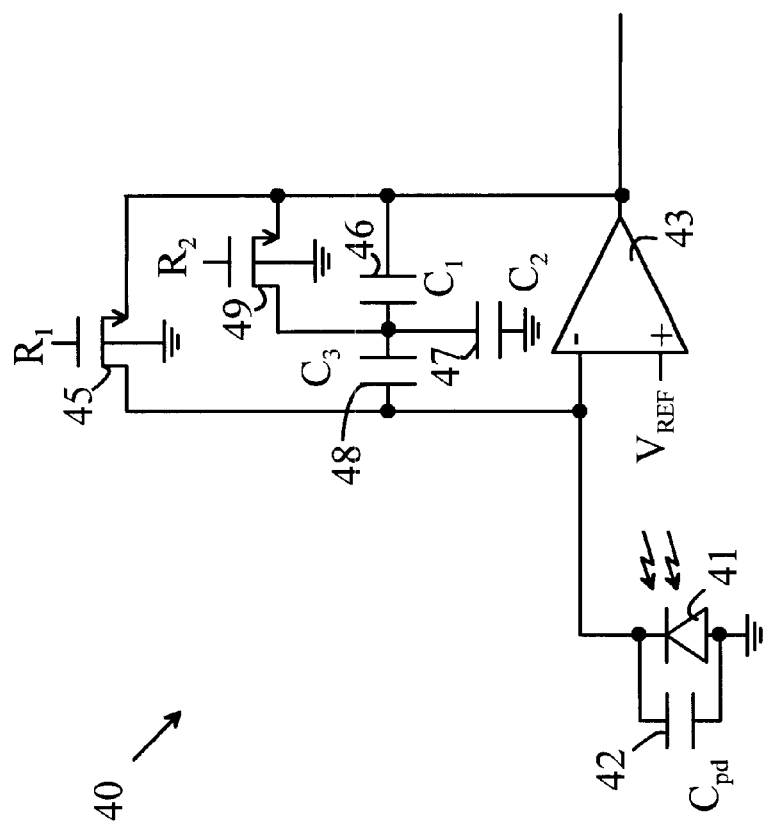
FIG. 2 is a schematic drawing of an imaging element 40 according to the present invention.

The present invention overcomes this problem by replacing the feedback capacitor 24 with a network of capacitors constructed from capacitors that are large enough to be reproducibly fabricated. The capacitors are chosen such that the network has a capacitance that is small compared to $C_{pd}$. Refer now to FIG. 2, which is a schematic drawing of an imaging element 40 according to the present invention. Imaging element 40 is similar to imaging element 20 shown in FIG. 1 in that it includes a photodiode 41 having a parasitic capacitor 42 having a capacitance denoted by $C_{pd}$. Imaging element 40 also includes a capacitive transimpedance amplifier constructed from an opamp 43 and a capacitive network consisting of capacitors 46–48 whose capacitances will be denoted by $C_1$–$C_3$, respectively, in the following discussion. Reset switches 45 and 49 short the capacitors prior to accumulating charge. The capacitance of the network is $C_3C_1/(C_1+C_2+C_3)$. Hence, if $C_3$ and $C_1$ are about the same size as $C_{pd}$, i.e., $C_1=C_3=C_{pd}$ and $C_2=G*C_{pd}$, where $G \gg 1$, the resulting network will have a capacitance that is approximately $C_{pd}/G$, and all of the capacitors will be of a size that can be reproducibly fabricated. In this case, the transimpedance amplifier provides a gain of G.

The reset switches are preferably operated such that switch 49 closes prior to switch 45. This order of operation minimizes the effects of the noise generated by the electrons leaving the transistors when the state of the switches changes.

Figure 3:
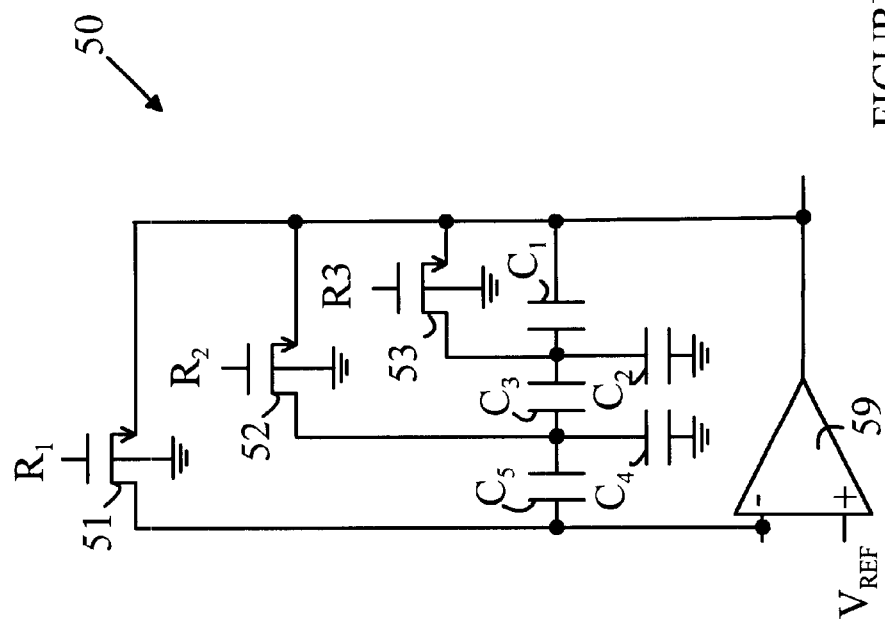
FIG. 3 is a schematic drawing of another embodiment of a transimpedance amplifier according to the present invention.

While the embodiment shown in FIG. 2 utilizes a three capacitor network and two shorting switches, it will be obvious to those skilled in the art from the preceding discussion that more complex networks may be utilized. Refer now to FIG. 3, which is a schematic drawing of another embodiment of a transimpedance amplifier according to the present invention. Transimpedance amplifier 50 is constructed from an opamp 59 and a capacitive feedback loop constructed from a 5 capacitor network whose capacitances are denoted by $C_1$–$C_5$. This network utilizes three shorting switches shown at 51–53. Transimpedance amplifier 50 provides higher gain for the same size capacitors. For example, if $C_1=C_3=C_5=C_{pd}$, and $C_2=C_4=G*C_{pd}$, then the effective capacitance of the network is approximately $C_{pd}/G^2$, and the gain of the transimpedance amplifier will be $G^2$.

The arrangement shown in FIG. 3 has the further advantage of providing a transimpedance amplifier with switchable gain. If during the operation of the amplifier shorting switch 53 remains closed, the effective capacitance of the network will increase, and the gain will decrease accordingly.

It will be apparent from the preceding discussion, that other capacitive networks may be utilized. For example, the networks shown in FIGS. 2 and 3 can be extended further by incorporating additional capacitive dividers and shorting switches. In addition, any other capacitive network connected to provide a net capacitance that is much less than $C_{pd}$ may also be used. It should be noted that a purely capacitive network is preferred, because resistors introduce thermal noise into the system. In this regard, it should be noted that inductors always have finite resistances, and hence, inductive networks are not preferred.

Various modifications to the present invention will become apparent to those skilled in the art from the foregoing description and accompanying drawings. Accordingly, the present invention is to be limited solely by the scope of the following claims.

What is claimed is:

1. An amplifier for measuring the charge on a source capacitor having first and second terminals and a capacitance of $C_{pd}$, said amplifier comprising:

an opamp having a signal input, reference input and output, said first terminal of said source capacitor being connected to said signal input;

a reset switch for shorting said signal input and said output of said opamp; and a capacitive network connecting said signal input and said output of said opamp, said capacitive network providing a capacitance of $C_T$ between said signal input and said output of said opamp wherein $C_T < C_{pd}$ and wherein said capacitive network is constructed from a plurality of component capacitors, each capacitor of said capacitive network having a capacitance value greater than or equal to $C_T$.

2. The amplifier of claim 1 wherein each component capacitor has a capacitance greater than or equal to $C_{pd}$.

3. An amplifier for measuring the charge on a source capacitor having first and second terminals and a capacitance of $C_{pd}$, said amplifier comprising:

an opamp having a signal input, reference input and output, said first terminal of said source capacitor being connected to said signal input;

a reset switch for shorting said signal input and said output of said opamp; and a capacitive network connecting said signal input and said output of said opamp, said capacitive network providing a capacitance of $C_T$ between said signal input and said output of said opamp wherein $C_T < C_{pd}$ and wherein said capacitive network is constructed from a plurality of component capacitors, wherein said capacitive network comprises first, second, and third component capacitors, each capacitor having first and second terminals, said first terminal of said first capacitor being connected to said output of said opamp; said second terminal of said first capacitor, said first terminal of said second capacitor, and said first terminal of said third capacitor being connected together at a first common node, said second terminal of said third capacitor being connected to said signal input of said opamp, and said second terminal of said second capacitor being connected to said second terminal of said source capacitor, said capacitive network further comprising a first network switch for connecting said first common node to said output of said opamp.

4. The amplifier of claim 3 wherein said first capacitor comprises a network constructed from fourth, fifth, and sixth component capacitors, said fourth, fifth, and sixth component capacitors being connected such that said fourth, fifth, and sixth capacitors are connected together at a common node, said network further comprising a second network switch for connecting said common node to said output of said opamp.

* * * * *